US009598278B2

(12) United States Patent
Le Neel et al.

(10) Patent No.: US 9,598,278 B2
(45) Date of Patent: Mar. 21, 2017

(54) METHOD OF MAKING A SUSPENDED MEMBRANE DEVICE

(71) Applicant: STMICROELECTRONICS PTE LTD, Singapore (SG)

(72) Inventors: Olivier Le Neel, Singapore (SG); Tien Choy Loh, Singapore (SG)

(73) Assignee: STMICROELECTRONICS PTE LTD., Singapore (SG)

( * ) Notice: Subject to any disclaimer, the term of this patent is extended or adjusted under 35 U.S.C. 154(b) by 0 days.

(21) Appl. No.: 14/679,906

(22) Filed: Apr. 6, 2015

(65) Prior Publication Data
US 2015/0210539 A1 Jul. 30, 2015

Related U.S. Application Data

(62) Division of application No. 13/907,708, filed on May 31, 2013, now Pat. No. 9,000,542.

(51) Int. Cl.
*H01L 29/84* (2006.01)
*H01L 27/14* (2006.01)
*B81C 1/00* (2006.01)
*B81B 3/00* (2006.01)

(52) U.S. Cl.
CPC ........ *B81C 1/00158* (2013.01); *B81B 3/0021* (2013.01); *B81B 2203/0127* (2013.01)

(58) Field of Classification Search
CPC ..... H01L 2924/1461; B81B 2201/0264; B81B 2203/0127; B81C 1/00158; B81C 2201/0109
See application file for complete search history.

(56) References Cited

U.S. PATENT DOCUMENTS

| | | | |
|---|---|---|---|
| 4,608,232 A | 8/1986 | Sunano et al. | |
| 4,608,323 A | 8/1986 | Sunano et al. | |
| 4,938,053 A | 7/1990 | Jepson et al. | |
| 5,834,777 A | 11/1998 | Wong | |

(Continued)

FOREIGN PATENT DOCUMENTS

| | | |
|---|---|---|
| CN | 201307027 Y | 9/2009 |
| CN | 102680016 A | 9/2012 |

(Continued)

OTHER PUBLICATIONS

Wilson et al.,"APTI Course 435 Atmospheric Sampling Student Manual: ," United States Environmental Protection Agency, Air Pollution Training Institute, Research Triangle Park, N.C., Chapter 3, Air measuring instruments, pp. 3-1 to 3-56, Sep. 1980, 61 Pages.

(Continued)

*Primary Examiner* — Pamela E Perkins
(74) *Attorney, Agent, or Firm* — Seed IP Law Group LLP

(57) ABSTRACT

The present disclosure is directed to a device that includes a substrate and a sensor formed on the substrate. The sensor includes a chamber formed from a plurality of integrated cavities, a membrane above the substrate, the membrane having a plurality of openings, each opening positioned above one of the cavities, and a plurality of diamond shaped anchors positioned between the membrane and the substrate, the anchors positioned between each of the cavities. A center of each opening is also a center of one of the cavities.

20 Claims, 11 Drawing Sheets

(56) References Cited

U.S. PATENT DOCUMENTS

| | | |
|---|---|---|
| 6,243,474 B1 | 6/2001 | Tai et al. |
| 6,352,874 B1 * | 3/2002 | McNeil ................ G01L 9/0073 |
| | | 438/251 |
| 6,383,832 B1 * | 5/2002 | Nakabayashi ........ B81B 3/0086 |
| | | 257/415 |
| 6,478,974 B1 | 11/2002 | Lebouitz et al. |
| 6,546,812 B2 | 4/2003 | Lewis |
| 6,698,297 B2 | 3/2004 | Gysling |
| 6,879,089 B2 | 4/2005 | Wong et al. |
| 7,280,436 B2 | 10/2007 | Pedersen |
| 7,556,895 B2 | 7/2009 | Moriya et al. |
| 7,703,339 B2 | 4/2010 | Sulouff, Jr. et al. |
| 7,821,085 B2 | 10/2010 | Suzuki et al. |
| 7,864,403 B2 | 1/2011 | Bita et al. |
| 7,880,315 B2 | 2/2011 | Beyne et al. |
| 7,946,505 B2 | 5/2011 | Lynam et al. |
| 8,062,497 B2 | 11/2011 | Witvrouw et al. |
| 8,258,017 B2 | 9/2012 | Masuko et al. |
| 8,390,121 B2 | 3/2013 | Okumura et al. |
| 8,487,387 B2 | 7/2013 | Lin et al. |
| 8,696,989 B2 | 4/2014 | Esfandyarpour et al. |
| 8,715,514 B2 | 5/2014 | Lee et al. |
| 8,806,933 B2 | 8/2014 | Kohno et al. |
| 8,852,513 B1 | 10/2014 | Speer et al. |
| 9,105,479 B2 | 8/2015 | Besling et al. |
| 9,164,052 B1 | 10/2015 | Speer et al. |
| 9,317,155 B2 | 4/2016 | Magi |
| 2002/0160611 A1 | 10/2002 | Horsley |
| 2002/0166376 A1 | 11/2002 | Kohmura et al. |
| 2003/0079542 A1 | 5/2003 | Bonne et al. |
| 2005/0109081 A1 | 5/2005 | Zribi et al. |
| 2008/0163687 A1 | 7/2008 | Kranz et al. |
| 2008/0194053 A1 | 8/2008 | Huang |
| 2008/0308920 A1 | 12/2008 | Wan |
| 2008/0315332 A1 * | 12/2008 | Kaelberer ............... B81B 3/001 |
| | | 257/415 |
| 2010/0173437 A1 | 7/2010 | Wygant et al. |
| 2010/0314740 A1 | 12/2010 | Choi et al. |
| 2011/0031565 A1 | 2/2011 | Marx et al. |
| 2011/0108932 A1 * | 5/2011 | Benzel ................ G01L 9/0073 |
| | | 257/415 |
| 2011/0150261 A1 | 6/2011 | Ho et al. |
| 2011/0298134 A1 | 12/2011 | Williams et al. |
| 2012/0024054 A1 | 2/2012 | Huang et al. |
| 2012/0032283 A1 | 2/2012 | Frey et al. |
| 2012/0167392 A1 | 7/2012 | Cherian et al. |
| 2012/0168882 A1 | 7/2012 | Cherian et al. |
| 2012/0171713 A1 | 7/2012 | Cherian et al. |
| 2012/0171774 A1 | 7/2012 | Cherian et al. |
| 2012/0299127 A1 | 11/2012 | Fujii et al. |
| 2013/0010826 A1 | 1/2013 | Le Neel et al. |
| 2013/0036806 A1 | 2/2013 | Kohno |
| 2013/0139587 A1 | 6/2013 | Le Neel et al. |
| 2013/0334620 A1 | 12/2013 | Chu et al. |
| 2014/0197500 A1 | 7/2014 | Guillemet et al. |
| 2014/0264655 A1 | 9/2014 | Williams et al. |
| 2014/0264744 A1 | 9/2014 | Chu et al. |
| 2014/0268523 A1 | 9/2014 | Gogoi |
| 2014/0311905 A1 | 10/2014 | Stetter et al. |

FOREIGN PATENT DOCUMENTS

| | | |
|---|---|---|
| CN | 102680018 A | 9/2012 |
| CN | 101788315 B | 11/2012 |
| CN | 202770456 U | 3/2013 |

OTHER PUBLICATIONS

J.M Lim, B.H. Yoon, Y.K Oh, Kyung-Am Park, "The humidity effect on air flow rates in a critical flow venturi nozzle," Flow Measurement and Instrumentation, 22:402-405, Jun. 4, 2011, 4 Pages.

Le Neel et al., "Microelectronic Enviromental Sensing Module," U.S. Appl. No. 13/853,801, filed Mar. 29, 2013, 37 Pages.

Le Neel et al., "Durable Minature Gas Composition Detector Having Fast Response Time," U.S. Appl. No. 13/853,805, filed Mar. 29, 2013, 36 Pages.

Le Neel et al., "Integrated Multi-Sensor Module," U.S. Appl. No. 13/853,732, filed Mar. 29, 2013, 37 Pages.

Le Neel et al., "Adhesive Bonding Technique for Use With Capacitive Micro-Sensors," U.S. Appl. No. 13/853,886, filed Mar. 29, 2013, 30 Pages.

* cited by examiner

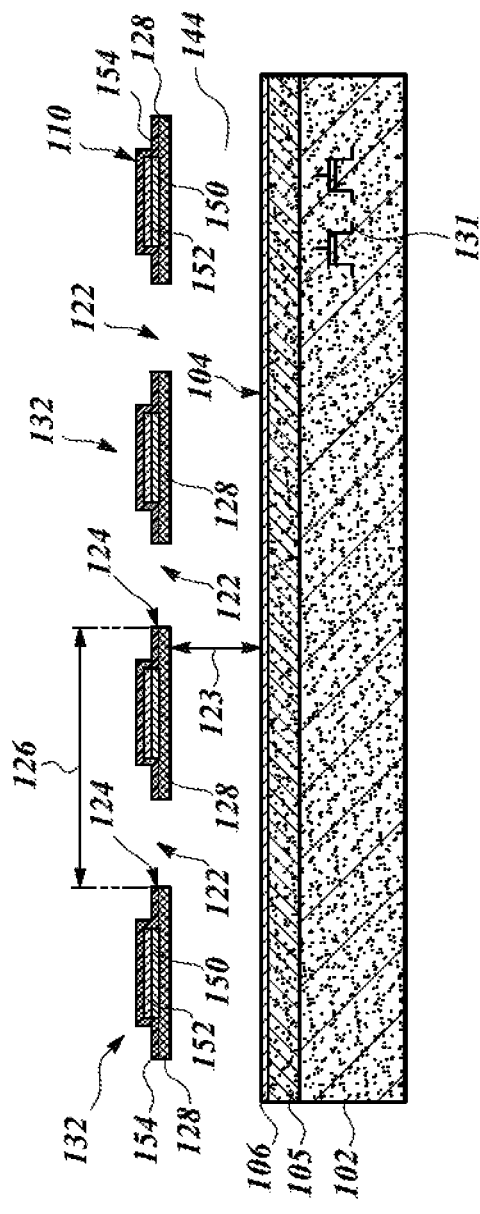
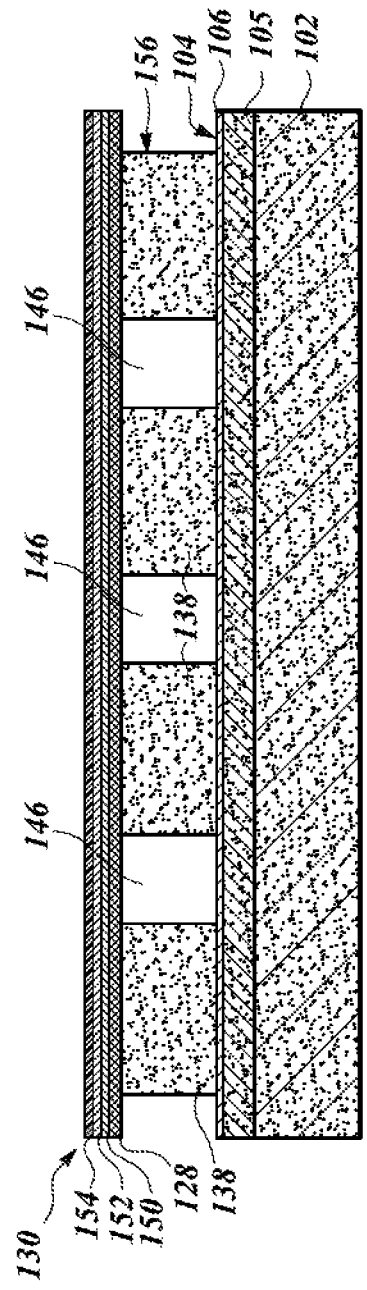
FIG.3
FIG.4

METHOD OF MAKING A SUSPENDED MEMBRANE DEVICE

BACKGROUND

Technical Field

The present disclosure is directed to a method of forming a sensor having a suspended membrane.

Description of the Related Art

Mobile computing devices such as smart phones and tablets include embedded electronic sensors such as, temperature, humidity, and pressure sensors. These sensors are being included to offer consumers or program developers features that entail sensing, monitoring, or controlling local environmental conditions. Providing additional environmental sensors within smart phones, tablet computers will encourage developers to create applications that provide or utilize the information about the temperature, humidity, and pressure of an environment.

Some existing products contain miniature environmental sensors, such as electronic climate control devices or thermostats. Such sensors can activate furnaces and air conditioners for feedback control of air temperature and humidity. Electronic weather stations also rely on internal temperature sensors, barometric pressure sensors, and humidity sensors. These miniature environmental sensors are fabricated separately, on separate substrates (separate die) from one another, or the sensors are built on one substrate and associated circuitry for signal processing and control is fabricated on a separate die.

These sensors are typically formed using silicon based free standing structures, such as structures formed by forming epitaxial layers of silicon and removing portions of the epitaxial layers for form the structures. Alternatively, several wafers are stacked, such that one is a base or support substrate and another, on top of the base, is etched to form the free standing structures. A membrane is supported by the free standing structures and separated from the base by a distance. Due to process limitations it is difficult to form free standing structures and a membrane that is separated from the base by more than four microns. The processes used to form these free standing structures are not compatible with forming integrated circuits on a same die as the free standing structures. Typically, the free standing structure is formed in one die and the integrated circuits are formed in another. The two die are bonded together such that the features are not on a single die. This leads to larger packages and a larger foot print on the printed circuit board of a device that incorporates such a sensor.

BRIEF SUMMARY

The present disclosure is directed to forming a sensor having a chamber of increased dimensions that permit a distance between a top electrode and a bottom electrode to be increased. A membrane is supported by a plurality of consistently spaced and shaped anchors. The membrane includes a plurality of openings through which portions of a support layer are removed in order to form the chamber. Separate cavities are formed in the support layer as the etch is preformed and as more material is removed, eventually the cavities are integrated with each other to form the chamber. A plurality of anchors remain to support the larger chamber.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

FIG. 3 is a cross-sectional view through a plurality of openings in the sensor along the cross-section line 3-3 in FIG. 2;

FIG. 4 is a cross-sectional view through a plurality of anchors in the sensor along the cross-section line 4-4 in FIG. 2;

DETAILED DESCRIPTION

Figure 1:
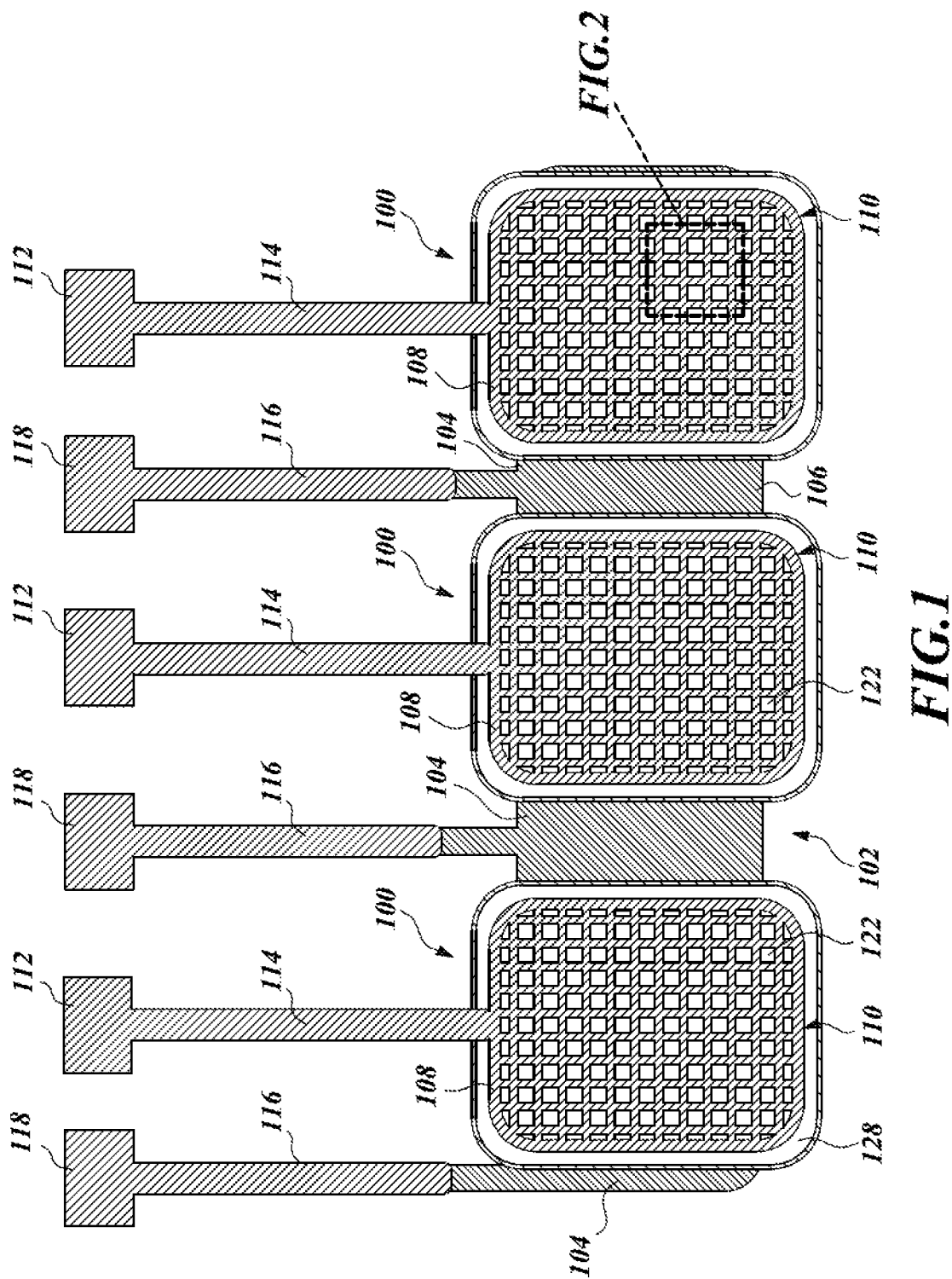
FIG. 1 is a top down view of a plurality of sensors that include a suspended membrane.

In the following description, certain specific details are set forth in order to provide a thorough understanding of various embodiments of the disclosure. However, one skilled in the art will understand that the disclosure may be practiced without these specific details. In some instances, well-known structures associated with semiconductor manufacturing have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale, but in many instances, do reflect actual scale and relative size between the components.

FIG. 1 is a top down view of a plurality of sensors 100 formed in accordance with an embodiment of the present disclosure. The sensors 100 are formed on a semiconductor substrate 102. The substrate may be a silicon wafer, a silicon germanium wafer, glass, or other suitable substrate. Each sensor 100 has a top electrode 108 and a bottom electrode 104. In this embodiment, each sensor 100 shares a bottom electrode 104, which is formed as a single conductive layer 106 on the substrate 102. In alternative embodiments, each sensor 100 will have a separate bottom electrode.

The sensors 100 may be one of a pressure sensor, a humidity sensor, a temperature sensor, an infrared sensor, or another type of sensor having a chamber. The sensors 100 are configured to include a membrane 128 formed between the bottom electrode 104 and the top electrode 108. The sensors 100 also include a chamber 144 that is configured to act as a capacitive dielectric between two capacitive plates, the top electrode 108 and the bottom electrode 104. For example, if the sensor is a pressure sensor, the membrane will move towards or away from the substrate in response to a change in pressure. An amount of movement of the membrane can be detected by a change in capacitance between the top and bottom electrode. Examples of types of sensors that could be formed using these chambers are described in the following co-owned and co-pending applications, U.S. patent application Ser. Nos. 13/853,886, 13/853,732, 13/853,801, and 13/853,805, which all have inventors in common.

The top electrode 108 is a conductive mesh 110 that includes a plurality of openings 122 thorough the conductive mesh 110 and the membrane 128. The openings 122 expose the chamber 144 and the bottom electrode 104 to ambient environmental conditions, such that the sensor 100 can detect a change in the environmental conditions.

In this embodiment, there are three sensors, each having a separate top electrode 108, where each is formed as a conductive mesh 110. Each of the top electrodes 108 are coupled to a contact pad 112 through an electrical interconnect 114. There are separate electrical interconnects 116 that couple the bottom electrode 104 to additional contact pads 118.

The sensor and fabrication method described in this disclosure can be used to form a single sensor or a plurality of sensors on a single substrate. In addition, the sensors described can be easily incorporated on a substrate that also includes integrated circuits, such as active and passive semiconductor components. For example, instead of having an application specific integrated circuit (ASIC) formed on a separate die, the transistors and other components used for detecting, analyzing, and transmitting signals and controlling the sensor can be incorporated in the substrate prior to formation of the sensor.

Figure 2:
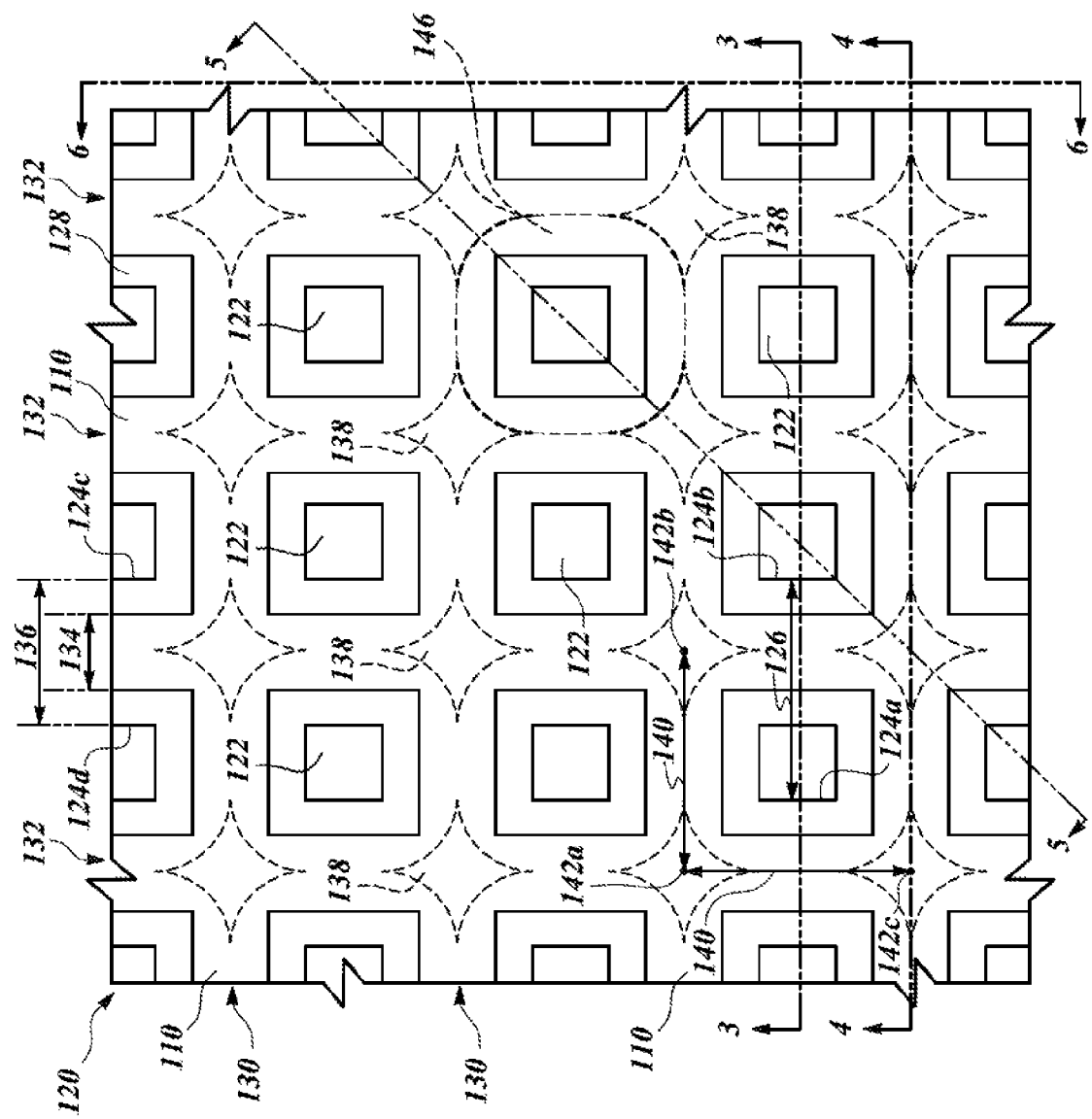
FIG. 2 is an enlarged and enhanced view of a portion of one of the sensors.

FIG. 2 is an enhanced view of a portion 120 of the right-most sensor 100 of FIG. 1. In this enhanced view, more details about the sensor 100 can be viewed. For example, features of the sensor are arranged in a consistent pattern. The plurality of openings 122 through the membrane 128 are evenly spaced and shifted with respect to a plurality of anchors 138. Each opening 122 in this embodiment is a square shaped opening through the membrane 128 that opens down towards the bottom electrode 104 on the substrate 102. The plurality of openings 122 are evenly spaced from each other, such that a distance 126 from a first left-most edge 124a to an adjacent left-most edge 124b remains constant throughout the sensor 100. The openings are used to etch away or otherwise remove portions of a support layer such that the remaining support layer forms the plurality of anchors 138. The etching forms a plurality of integrated cavities 146, which are discussed in more detail below.

The conductive mesh 110 forms a plurality of intersecting rows 130 and columns 132 on top of the membrane, where the openings 122 are centrally positioned between intersections of the rows 130 and columns 132. A width 134 of the rows 130 and the columns 132 is smaller than a width 136 of the membrane 128. The difference in the widths forms a shelf or step down from the edge of the conductive mesh 110 to the membrane 128, see FIG. 3. The width 136 of the membrane 128 extends from a right-most edge 124d of a first opening 122 to a left-most edge 124c of a second opening 122, that is adjacent to the first opening.

The plurality of anchors 138 are positioned beneath intersections of the rows 130 and columns 132. The anchors 138 are evenly spaced, such that a center 142a of each anchor 138 is separated from adjacent centers 142b, 142c by a distance 140. Each anchor 138 is diamond shaped from a top down view. The diamond shape is formed as the plurality of cavities 146 are formed by etching through the openings 122, where boundaries of each cavity blend with boundaries of adjacent cavities. The plurality of cavities 146 are integrated together to form the chamber 144. The membrane 128 is suspended above the chamber 144.

The cavities having a square shape with rounded corners, see the dashed line representing a cavity 146. Boundaries of each cavity correspond to one face of fourth adjacent anchors and each cavity shares a top, right, bottom, and left boundary with adjacent cavities.

The arrangement of the anchors 138 and the openings 122 provide a large supported area, such that the membrane 128 and the chamber 144 span a large area. For example, the area of the chamber and the capacitive plates, the bottom and top electrodes, may be 500 microns by 500 microns. Increasing the area of the capacitive plates can increase the sensitivity of the sensor. The support layer is removed in a controlled process that forms the semi-suspended membrane 128; semi-suspended because the anchors are evenly spaced at regular intervals beneath the membrane. In addition, a height 123 of the chamber 144 may be greater than 4 microns as a result of the intervals of support provided by the anchors 138.

FIG. 3 is a cross-sectional view of the portion 120 of the sensor 100 taken through the cross-section line 3-3. The line 3-3 is through a middle of the openings 122 and crosses through several of the columns 132. Each column 132 includes several layers. A first, lowest layer, is the membrane 128. The membrane 128 is separated from the bottom electrode 104 by the chamber 144. The chamber 144 is formed by the plurality of integrated cavities 146, where boundaries of each cavity blend with boundaries of adjacent cavities, see FIG. 2 for a top down view. The membrane 128 may be formed of silicon nitride or other suitable material for forming a flexible membrane. The membrane may be in the range of 5000 Angstroms to 2 microns in thickness.

A second, intermediate layer, is the conductive mesh 110 of the rows 130 and columns 132 is formed on the membrane 128. In this embodiment, the conductive mesh 110 includes a barrier layer 150 on the membrane 128 and a metal layer 152 on the barrier layer 150. The barrier layer 150 may be titanium tungsten, titanium nitride, or other material with sufficient barrier properties. The metal layer 152 may be gold, aluminum, or other suitable conductive material. In some embodiments, the conductive mesh 110 may only be a single metal layer 152. The metal layer 152 may be 1000 Angstroms in one embodiment. Because of under etching when the conductive mesh is formed, the barrier layer may have a smaller width than the metal top layer.

A third, top layer, is a passivation layer 154. The passivation layer 154 covers a top of the sensor 100 and protects the layers from external factors. Silicon nitride may be utilized as the passivation layer 154.

The bottom electrode 104 is formed from a conductive layer 106 formed on a surface of the substrate 102. In some embodiments, a dielectric layer 105 is formed on the substrate 102 to isolate the bottom electrode 104 from the substrate. The dielectric layer 105 physically and electrically separates the conductive layer 106 from the substrate 102. For example, if the substrate 102 includes a plurality of transistors or other integrated circuit components 131, the dielectric layer 105 may be included to sufficiently isolate the integrated circuit components from the bottom electrode 104. The dielectric layer 105 may be a thick layer of silicon dioxide. If glass is used for the substrate, the dielectric layer 105 may be omitted.

In this view, the plurality of cavities 146 are blended together such that the chamber 144 is one open space. However, as can be seen in FIG. 4, the cavities 146 are separated from each other by the anchors 138. The anchors provide the support to make the membrane 128 with a large surface area.

FIG. 4 is a cross-sectional view through the plurality of anchors 138 of FIG. 2 taken through the line 4-4. The line 4-4 passes through the center 142 of the anchors 138, which passes through a widest part of the anchors 138. As can be seen in FIG. 2, the anchors 138 are diamond shaped from a top down view. The anchors 138 are remnants of a dielectric layer 156 that remain after an etch step that is performed through the openings 122 to form the cavities 146.

The anchors 138 and the chamber 144 have the same height 123 in a rest state. For example, the height 123 may be greater than 4 microns. During use, the membrane 128 can move towards and away from the bottom electrode 104, changing the height of the cavities 146.

Figure 5:
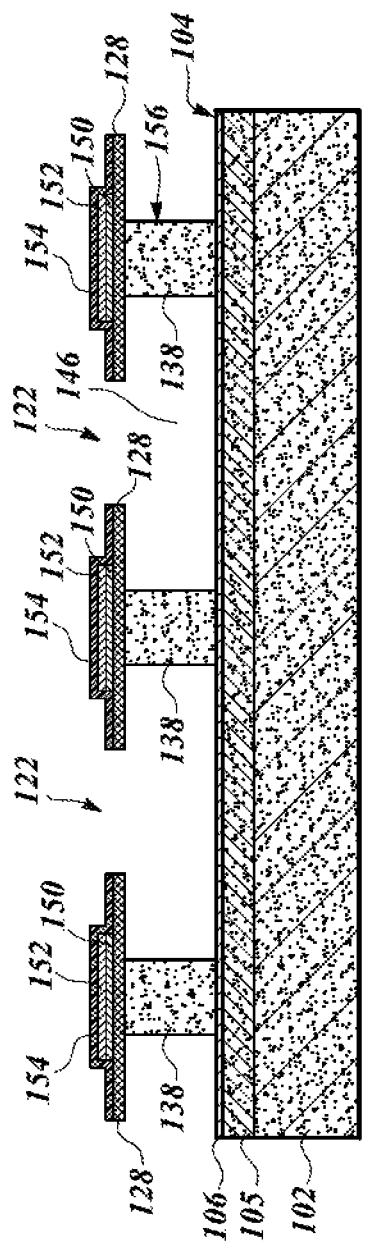
FIG. 5 is a cross-sectional view through a plurality of the openings and the anchors in the sensor along the cross-section line 5-5 in FIG. 2.

FIG. 5 is a cross-sectional view taken diagonally through FIG. 2 along cross-section line 5-5. The line 5-5 passes through multiple openings 122 and anchors 138. The line 5-5 passes through a thinnest part of the anchor 138 and shows a widest dimension of the cavity 146.

Figure 6:
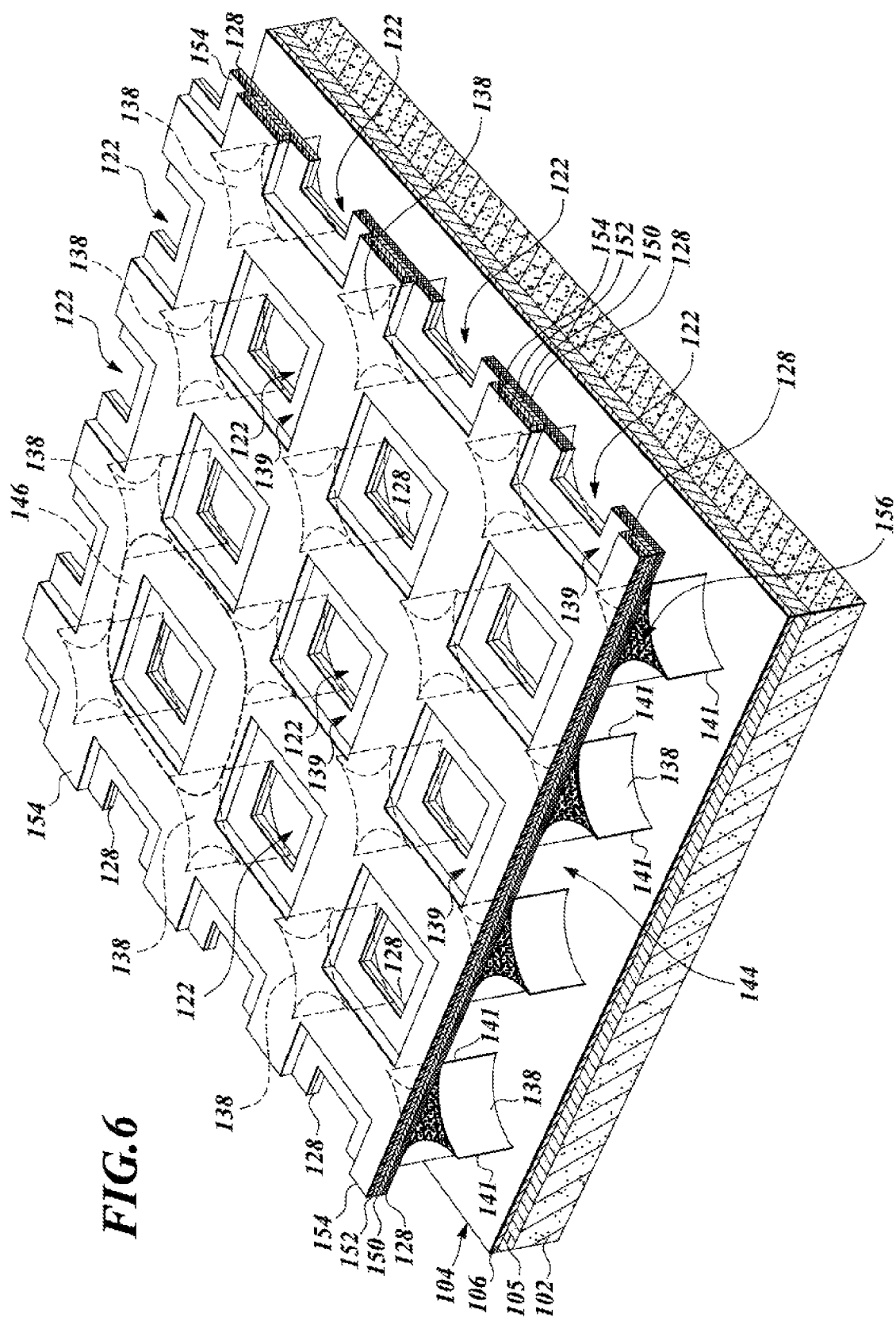
FIG. 6 is a perspective view of the portion of the sensor in FIG. 2 with cut lines that correspond to line 4-4 and 6-6.

FIG. 6 is an isometric view of the portion 120 of the sensor 100 of FIG. 2 taken along line 4-4 and 6-6. The cross-section is made through the membrane 128, the conductive mesh 110, and the passivation layer 154 along line 4-4, but is not made through the anchors 138. The curvatures of the sidewalls of the anchors 138 can be more clearly seen in this view. The membrane 128 rests on a top surface of each of the anchors 138.

The rows 130 and columns 132 of the conductive mesh 110 intersect on top of each of the anchors 138. The anchors support 138 the conductive mesh, while the membrane extends away from the anchors over the cavities 146. The width of the rows and columns is less than the width of the membrane such that the membrane is suspended above the bottom electrode 104 while the conductive mesh 110 is supported.

The differences in the widths of the conductive mesh and the membrane form steps or shelves 139, such that a top surface of the conductive mesh is positioned further away from the bottom electrode than a top surface of the membrane. The steps 139 are associated with portions of the membrane 128 that are only covered by the passivation layer 154.

Figure 7:
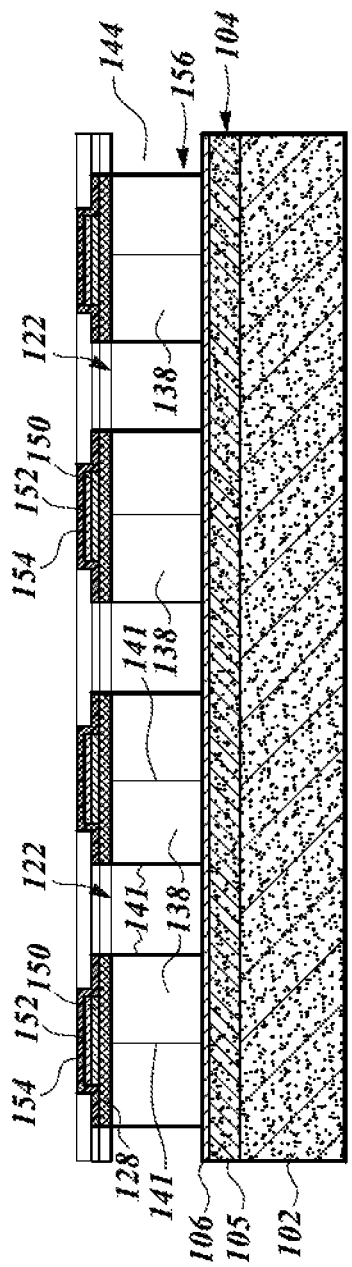
FIG. 7 is a right side view of the portion in FIG. 6.
Figure 8:
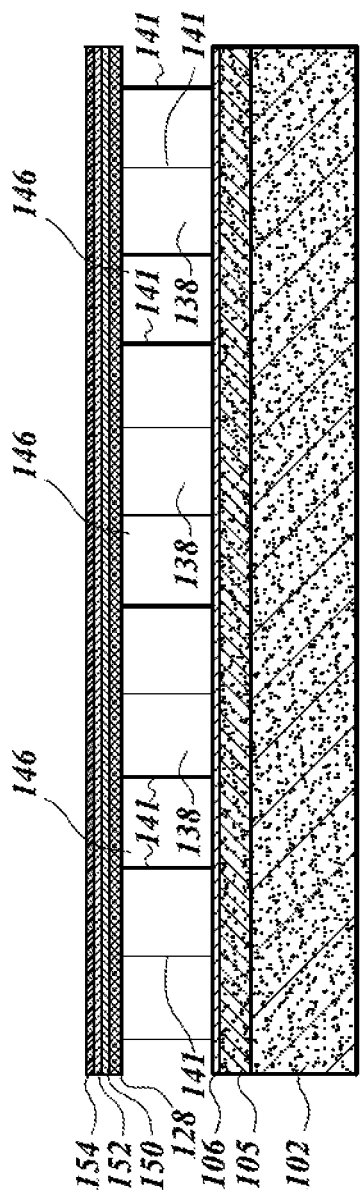
FIG. 8 is a front view of the portion in FIG. 6.

FIGS. 7 and 8 are a front and right side view of the portion 120 as viewed in FIG. 6. Points or edges 141 of the anchors 138 are visible because the anchor 138 is shown as complete, as opposed to a cross-sectional view. Each anchor 138 has four edges 141 that are facing adjacent edges from a neighboring anchor.

Figure 9:
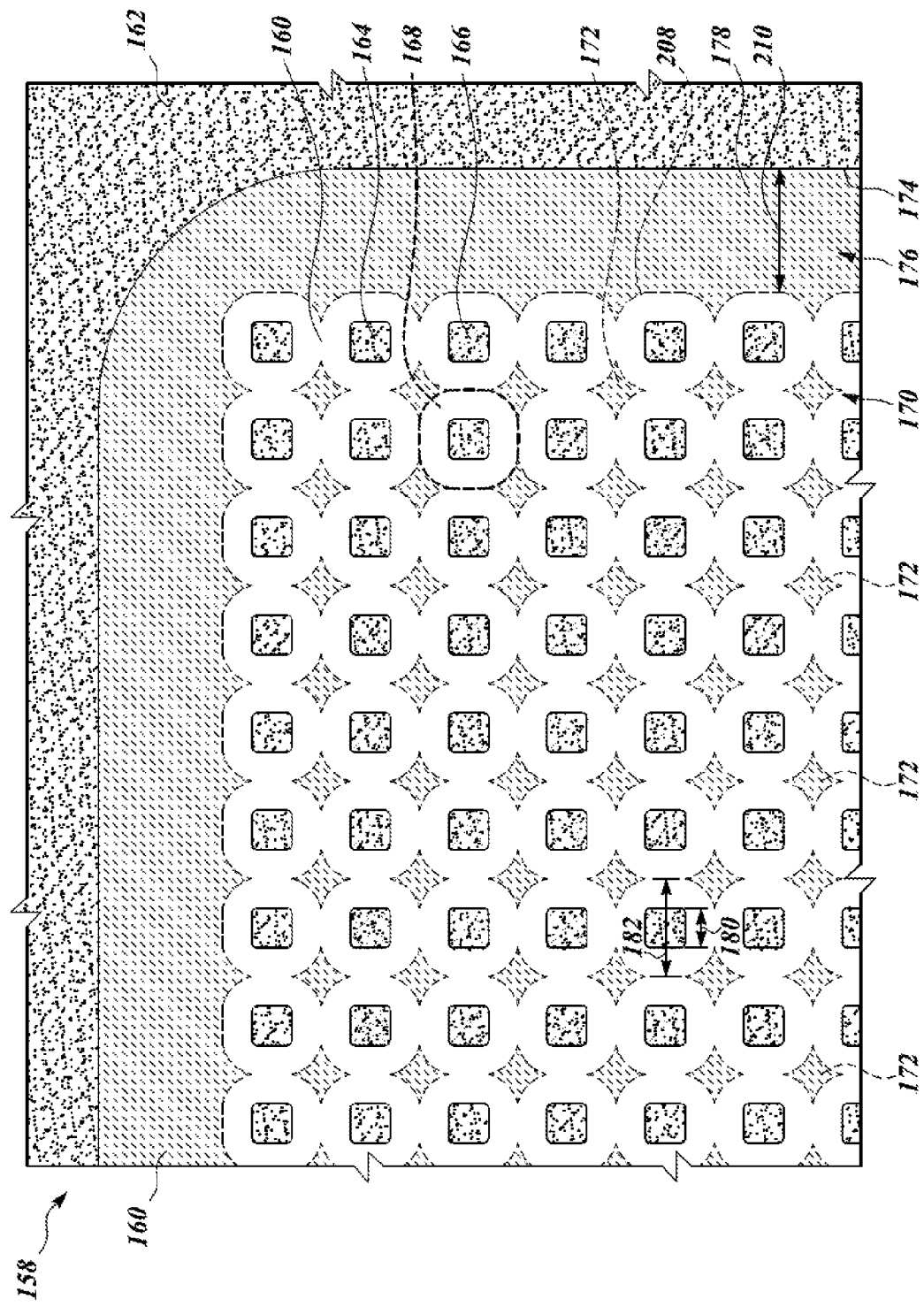
FIGS. 9 and 10 are a top down view of an alternative embodiment of a corner of a sensor having a suspended membrane.
Figure 10:
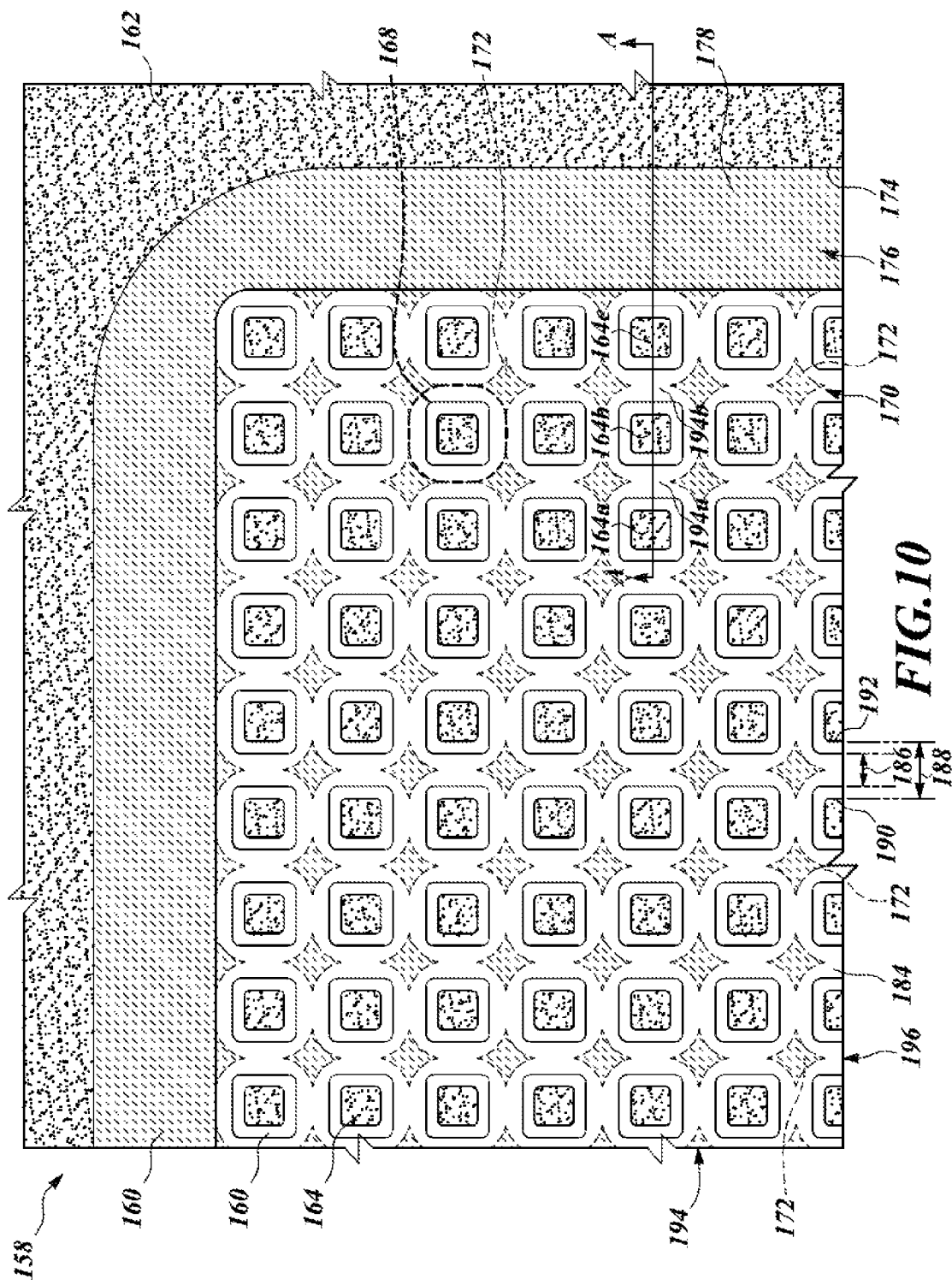

FIGS. 9 and 10 are directed to another embodiment of one of the sensors 100, shown in FIG. 1. FIG. 9 is an enhanced view of a corner 158 that shows a membrane 160 formed on top of a substrate 162 without a conductive mesh 184 on top of the membrane 160, see FIG. 10. The membrane has a plurality of openings 164 that expose the substrate 162 beneath the membrane 160. This embodiment is different from the embodiment in FIGS. 1-8 in that there is not a bottom electrode, i.e., the substrate is visible through the openings 164.

The openings 164 are positioned at a center 166 of a plurality of cavities 168 formed between the membrane 160 and the substrate 162. Together the plurality of cavities 168 form a larger chamber 170. A plurality of anchors 172 are positioned beneath the membrane, separating the membrane from the substrate. The anchors are spaced at intervals in the chamber 170.

In this embodiment, the openings are generally square, however, in other embodiments, the openings may have a different shape, such as a circle. The shape of the opening affects the shape of the anchors 172. In particular, the anchors 172 are diamond shaped in this embodiment because the openings are square and because an isotropic etch was used to remove excess portions of a support layer 176. The support layer 176 starts as a thick layer of material completely separating the substrate 162 from the membrane 160. After the openings 164 are formed, an isotropic etch is performed to remove portions of the support layer 176, leaving the anchors 172.

In this view, the anchors 172 are show to be in dashed lines because the membrane 160 is on top of the anchors. A boundary 174 of the membrane 160 is spaced from an edge 208 of the chamber 144 by a distance 210. This boundary region 178 is a remaining portion of the support layer 176, covered by the membrane 160. This boundary region that remains after the etch that forms the cavities. The boundary region 178 can be seen more clearly in FIGS. 11-16.

The membrane extends across the top of every anchor 172 and extends out to the boundary 174 of the membrane 160. Each cavity 168 is formed by etching the support layer 176 through the opening 164. An isotropic etch is performed through each opening 164 in order to form consistently shaped cavities 168. As the etchant removes the support layer 176 through each opening 164, a width 180 continues to expand to a larger width 182. As the width 180 expands to the larger width 182, adjacent cavities 168 become integrated such that there are openings between adjacent ones of the anchors 172 and the chamber 170 is formed.

FIG. 10 is a top down view of the membrane 160 in FIG. 9, including the conductive mesh 184 that is formed on top of the membrane 160. The conductive mesh has a width 186 that is smaller than a width 188 of the membrane 160. The width 188 of the membrane 160 is from a rightmost edge 190 of a first opening 164 to a leftmost edge 192 of an adjacent opening 164.

FIGS. 9 and 10 are illustrative in the sense that FIG. 9 is the same as FIG. 10, except that the conductive mesh 184 is not included. FIG. 9 illustrates the orientation of the anchors 172 with respect to the centers 166 of the openings 164 and formation of the cavities 146. The top down view in FIG. 9 is a simplified view of the sensor. There may be some applications where the conductive mesh is not utilized, however, in the sensor that detects capacitive differences, the conductive mesh 184 is included. As in FIG. 10, the conductive mesh will be positioned on top of the anchors 172 and on top of the membrane 160.

In an embodiment that does include the conductive mesh 184, the openings 164 through the membrane will not be formed until after the conductive mesh is formed. This will be described in further detail below with respect to FIGS. 11-16. The conductive mesh 184 is arranged in a plurality of rows 194 and columns 196 that intersect on top of the anchors 172. The anchors 172 are support structures that maintain the membrane 160 at a consistent distance from the substrate 162 in a rest state.

FIGS. 11-16 are a cross-sectional view through a portion of the corner 158 of FIG. 10 showing a series of process step used to form the sensor. The cross-section line is taken through three openings 164a, 164b, and 164c, see FIGS. 10 and 15. In addition, the cross-section line passes through two complete rows 194a and 194b. The cross-section line also passes through the boundary region 178 of the membrane 160, which is on top of a remaining portion 176a of the support layer 176, see FIG. 16.

Figure 11:
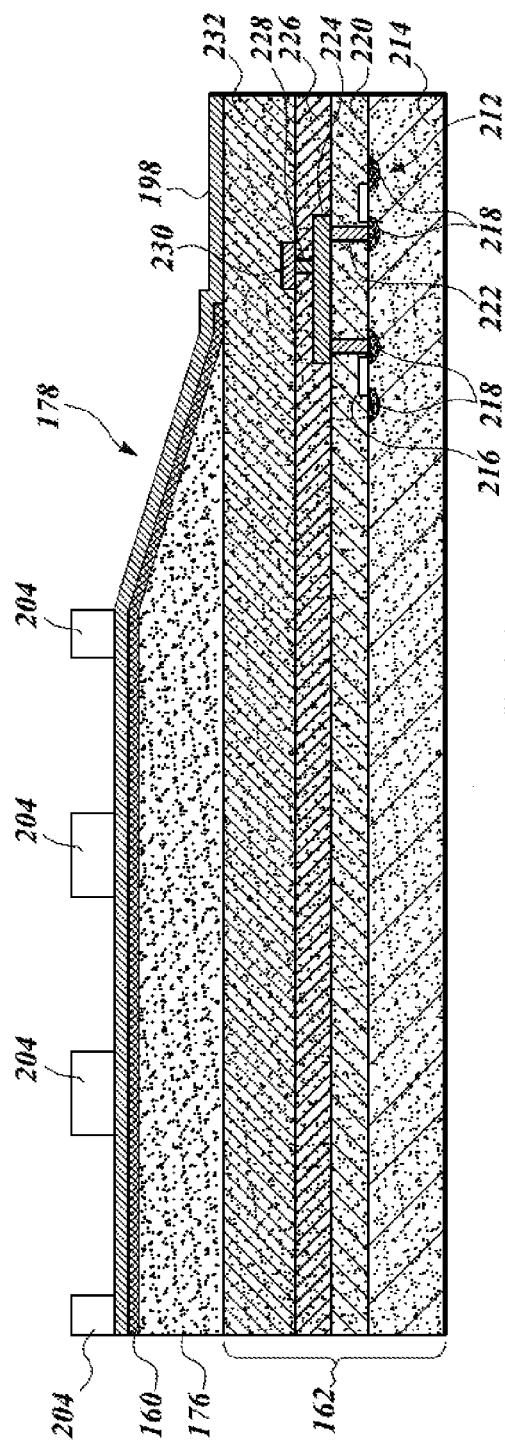
FIGS. 11-16 are cross-sectional views showing a plurality of process steps to form the sensor and the suspended membrane taken along the cross-section line A-A of FIG. 10.

In FIG. 11, transistors 212 are formed in the substrate 162. In this embodiment, the transistors are formed on and in a first surface of a semiconductor wafer 214. Each transistor 212 includes a gate 216 and source/drain regions 218. A first interlevel dielectric 220 is formed on the gates 216 and on the wafer 214. Vias are formed through the first interlevel dielectric 220 and filed with a conductive material to form conductive plugs 222.

A first metal layer 224 is formed on the first dielectric 220 and electrically couples the conductive plugs 222. A second interlevel dielectric 226 is formed on the first metal layer 224. Vias are formed through the second interlevel dielectric 226 and filed with a conductive material to form conductive plugs 228. A second metal layer 230 is formed on the second interlevel dielectric 226 and coupled to the conductive plug 228. A third interlevel dielectric 232 is formed on the second metal layer 230.

The third interlevel dielectric 232 may be thicker than the first and second interlevel dielectrics in order to sufficiently isolate the transistors 212 and metal layers from the chamber 170. After the active circuit elements are formed, the support layer 176 is formed. The support layer may be 4 microns or more in thickness. In one embodiment, the support layer 176 is polyimide.

Polyimide has properties that allow it to be manipulated and processed at temperatures that do not harm active elements, such as the transistors 212. The polyimide is deposited, spun, and then cured. After the cure, the polyimide may have between 2 and 8 microns in thickness, the space between the membrane and the substrate. A second polyimide may be included to make the thickness of the polyimide greater, such as between 12 and 16 microns.

The membrane 160 is formed on top of the support layer 176. In one embodiment, the membrane layer is silicon nitride. Additional materials may be used to form the membrane in the support layer by one of ordinary skill in the art.

A conductive layer 198 is formed on top of the membrane 160 before any openings are formed in the membrane 160. The membrane may be transparent, which allows the anchors below the membrane to be visible from a top down view. In this embodiment, only a single conductive layer is presented, however, the conductive mesh may be formed of a plurality of conductive layers.

Figure 12:
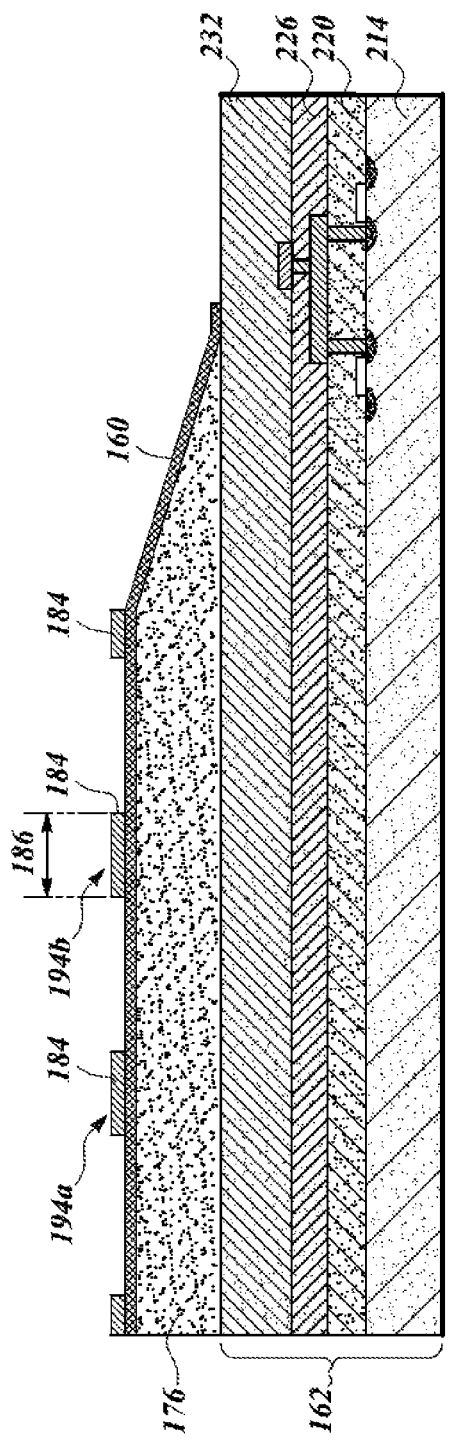

A mask 204 is formed on the conductive layer 198 to define the conductive mesh 184. An etching step is performed to remove excess portions of the conductive layer 198, so that the conductive mesh 184 remains. As can be seen in FIG. 12, each row 194 has a width 186. As can be viewed in FIG. 10, the conductive mesh has extensions that are similar to bridges that extend between anchors, once the anchors and cavities have been formed.

Figure 13:
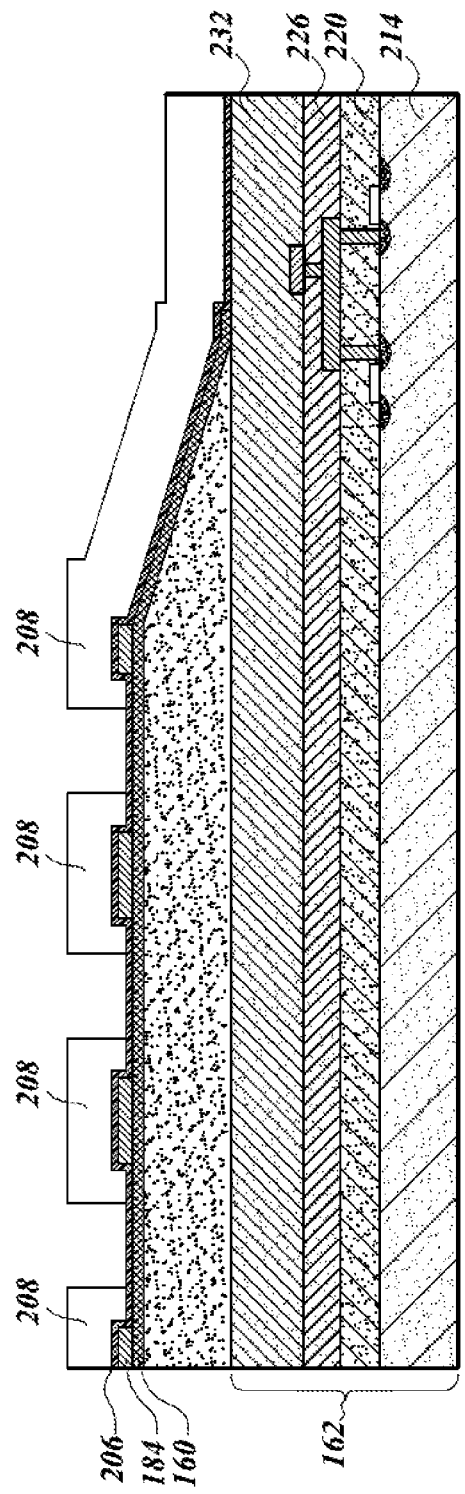
Figure 14:
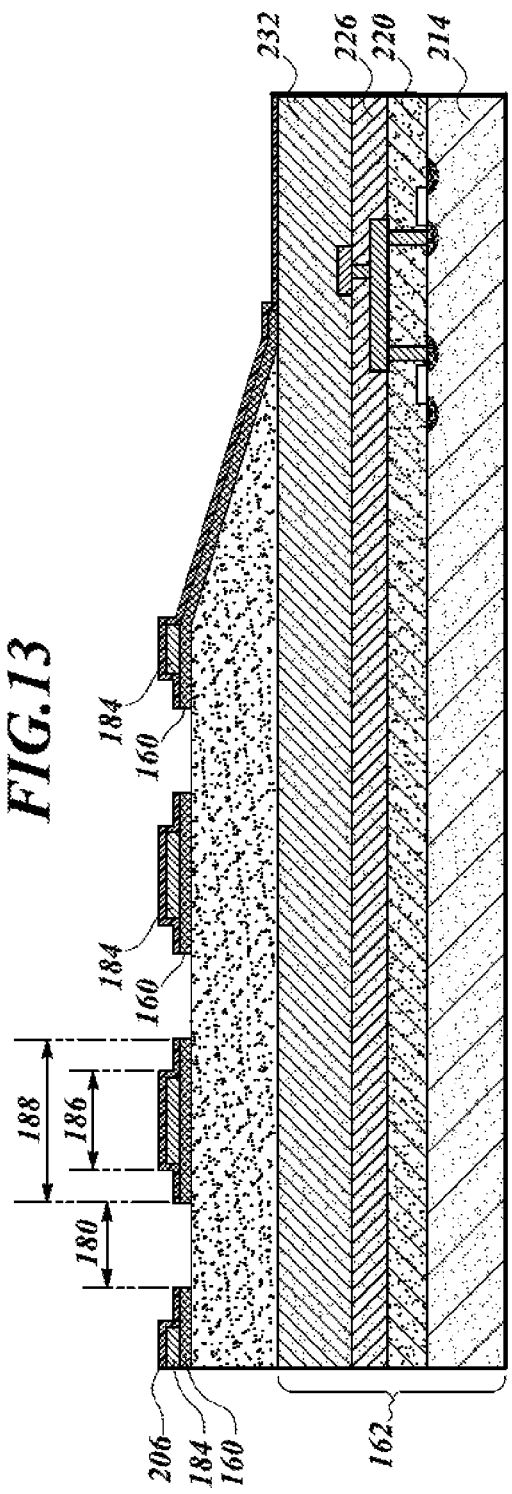

In FIG. 13, a dielectric layer 206 is formed overlying the conductive mesh 184 and the membrane 160. The dielectric layer 206 may be silicon dioxide, silicon nitride, or any other suitable material for passivating or protecting the different layers. Another mask 208 is formed overlying the dielectric layer 206 in order to form the openings 164a, 164b, 164c. Subsequently, an etch is performed to remove excess portions of the dielectric layer 206 and the membrane 160, see FIG. 14. This forms the plurality of openings 164. Each opening has the width 180, as was shown in FIG. 9, while the membrane has the width 188 and the conductive mesh has the width 186.

Figure 15:
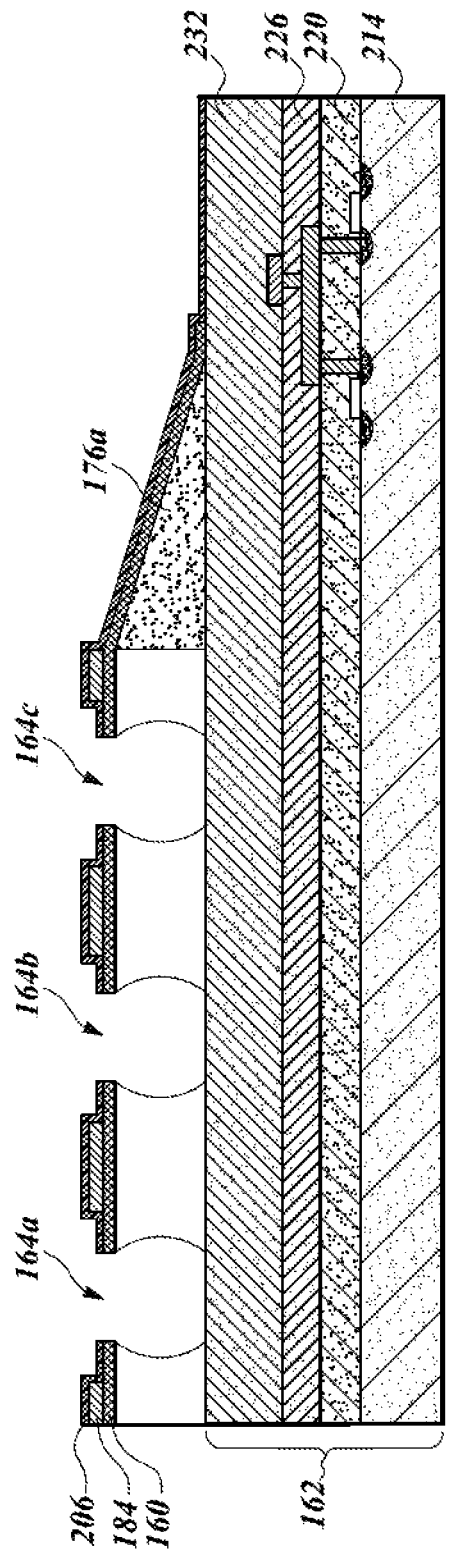
Figure 16:
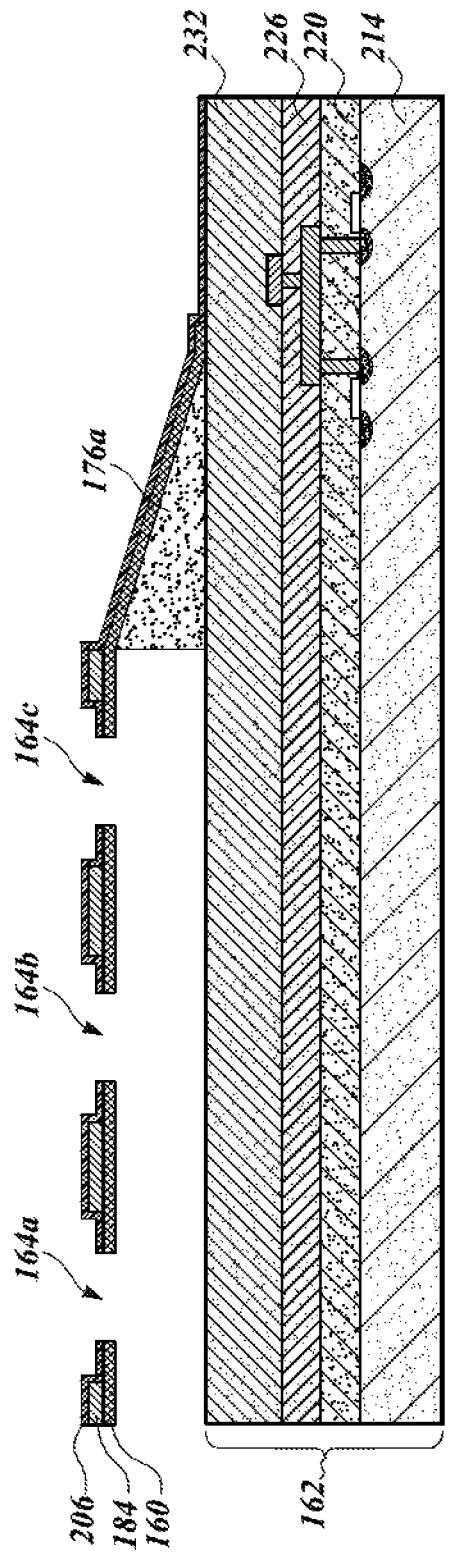

In FIG. 15, an etch is performed through the openings 164a, 164b, 164c the membrane to remove excess portions of the support layer 176 such that the anchors remain. FIG. 15 shows an intermediate step in the process where the etch is not yet complete. FIG. 16 shows the sensor once the etch has been completed. None of the anchors are visible in FIG. 16 because of where the cross-section line is positioned in FIG. 10.

In one embodiment, a $O_2$ Plasma etch may be used to remove portions of the support layer through the openings in the membrane. During the etch, process conditions of RF 900 Watt, a pressure of 1200 mT, with $O_2$ 2000 sccm, and $N_2O$ 100 sccm are beneficial. An example of an etch machine that may be configured to perform this process is an IPC Gasonics L3510.

This process can be performed where the temperature in the chamber is kept at or below 200 degrees Celsius. Maintaining this temperature profile is beneficial in that the polyimide structural layer is removed in a controlled manner. In particular, oxygen radicals produced by a microwave generator react with the polyimide to form a gaseous by-product. This chemical reaction in controlled by the chamber pressure. The polyimide is removed by an isotropic etch until the anchors are formed.

Above 200 degrees Celsius polyimide removal can be too aggressive and can cause the remaining polyimide to be deformed. The dimensions and consistency of the anchor shape becomes more difficult as the temperature exceeds 200 degrees Celsius. At 100 degrees Celsius, the diamond shaped anchors can be formed consistently and accurately, however, the time to form the structures is significantly longer than a process at 200 degrees Celsius.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a support layer on a substrate;
   forming a membrane layer on the support layer;
   forming a plurality of openings in the membrane layer;
   forming a single, contiguous chamber having a plurality of integrated cavities, each of the plurality of openings positioned above and aligned with one of the plurality of integrated cavities; and forming a plurality of anchors in the single, contiguous chamber by removing portions of the support layer below the openings in the membrane layer.

2. The method of claim 1, further comprising:
forming a first electrode on the substrate between the support layer and the substrate;
forming a second electrode on the membrane layer, the membrane layer being between the first electrode and the second electrode.

3. The method of claim 2 wherein the contiguous chamber and the membrane layer separate the first electrode and the second electrode.

4. The method of claim 2, further comprising forming the second electrode as a conductive mesh having intersecting rows and columns.

5. The method of claim 4, further comprising forming an intersection between the rows and columns above each anchor.

6. The method of claim 1 wherein each integrated cavity is centered around one of the openings and having a square shape with rounded corners, as seen from a top down view.

7. The method of claim 1 wherein the anchors are diamond shaped.

8. A method, comprising:
forming a bottom electrode on a substrate;
forming a support layer on the bottom electrode;
forming a sensor layer overlying the support layer, the sensor layer including a thin film membrane;
forming a top electrode as a conductive mesh having openings therein, the openings exposing areas of the thin film membrane; and
forming a contiguous chamber having a plurality of integrated cavities by etching the support layer through the openings for a selected time, each of the openings positioned above and aligned with one of the plurality of integrated cavities, the etching continuing until the support layer is removed sufficient to form an array of supporting anchors that suspend the thin film membrane.

9. The method of claim 8 wherein the thin film membrane is made of silicon nitride.

10. The method of claim 8 wherein forming the support layer further includes
covering the bottom electrode with a photo-patternable material;
exposing the photo-patternable material to light; and
curing the photo-patternable material.

11. The method of claim 8 wherein the support layer is made of polyimide.

12. The method of claim 8 wherein the etching entails etching the support layer in a low-temperature process, below 200 C.

13. The method of claim 8 wherein the support layer has a height within the range of 2.0-8.0 μm.

14. The method of claim 8 wherein the substrate includes an integrated circuit.

15. The method of claim 8 wherein the anchors contact a total surface area of the thin film membrane that is within the range of 5-15%.

16. The method of claim 8 wherein the etching uses an isotropic plasma etching process that produces anchors having curved sidewalls.

17. The method of claim 16 wherein the plasma etching process accesses the support layer through the openings in the exposed areas of the thin film membrane.

18. The method of claim 8, further comprising:
forming a passivation layer covering the top electrode; and
forming openings in the passivation layer.

19. The method of claim 18 wherein the openings in the exposed areas of the thin film membrane are aligned with the openings in the passivation layer.

20. The method of claim 8 wherein the suspended thin film membrane is a flexible membrane suitable for use as a pressure sensor.

* * * * *